United States Patent
Yeh et al.

(10) Patent No.: US 11,635,777 B2
(45) Date of Patent: Apr. 25, 2023

(54) TEMPERATURE CONTROL CIRCUIT, MEMORY STORAGE DEVICE AND TEMPERATURE CONTROL METHOD

(71) Applicant: PHISON ELECTRONICS CORP., Miaoli (TW)

(72) Inventors: Jia-Huei Yeh, Miaoli County (TW); Chao-Ta Huang, Miaoli (TW); Yi-Feng Li, Miaoli County (TW); Po-Chieh Chiu, Taoyuan (TW); Chun-Yu Ling, Miaoli (TW)

(73) Assignee: PHISON ELECTRONICS CORP., Miaoli (TW)

( * ) Notice: Subject to any disclaimer, the term of this patent is extended or adjusted under 35 U.S.C. 154(b) by 836 days.

(21) Appl. No.: 16/427,289

(22) Filed: May 30, 2019

(65) Prior Publication Data

US 2020/0326736 A1 Oct. 15, 2020

(30) Foreign Application Priority Data

Apr. 11, 2019 (TW) .................................. 108112772

(51) Int. Cl.
*G05D 23/24* (2006.01)
*G05D 23/19* (2006.01)
(Continued)

(52) U.S. Cl.
CPC ..... *G05D 23/2401* (2013.01); *G01R 31/2874* (2013.01); *G05D 23/1931* (2013.01); *H01L 23/34* (2013.01)

(58) Field of Classification Search
CPC ........... G05D 23/2401; G05D 23/1931; G01R 31/2874; H01L 23/34
See application file for complete search history.

(56) References Cited

U.S. PATENT DOCUMENTS 5,875,142 A * 2/1999 Chevallier ............. G11C 5/143
374/E7.035
10,116,296 B2 * 10/2018 Tsurumaru ....... H03K 17/08128
(Continued)

FOREIGN PATENT DOCUMENTS

| CN | 1635447 | 7/2005 |
| CN | 1991781 | 7/2007 |

(Continued)

OTHER PUBLICATIONS

"Office Action of Taiwan Counterpart Application", dated Jul. 5, 2019, p. 1-p. 9.
(Continued)

*Primary Examiner* — Akm Zakaria
(74) *Attorney, Agent, or Firm* — JCIPRNET

(57) ABSTRACT

A temperature control circuit for an electronic device is provided. The temperature control circuit includes a temperature detector, a status detection circuit and a control circuit. The temperature detector is configured to detect a temperature of the electronic device and generate first evaluation information. The status detection circuit is configured to detect a work status of at least one circuit module in the electronic device and generate second evaluation information. The control circuit is configured to adjust at least one electronic parameter of the electronic device according to the first evaluation parameter and the second evaluation parameter to control the temperature of the electronic device.

33 Claims, 6 Drawing Sheets

(51) Int. Cl.
    *G01R 31/28*     (2006.01)
    *H01L 23/34*     (2006.01)

(56) References Cited

U.S. PATENT DOCUMENTS

| | | | | |
|---|---|---|---|---|
| 2007/0188254 | A1* | 8/2007 | Sutardja | H03L 7/1976 |
| | | | | 257/E23.08 |
| 2012/0133427 | A1* | 5/2012 | Kim | H01L 23/49822 |
| | | | | 327/564 |
| 2012/0212319 | A1* | 8/2012 | Ling | G06F 1/3231 |
| | | | | 340/3.1 |
| 2015/0060429 | A1* | 3/2015 | Song | H05K 7/20 |
| | | | | 219/209 |
| 2015/0363342 | A1* | 12/2015 | Tuers | G06F 12/0238 |
| | | | | 710/308 |
| 2019/0163221 | A1* | 5/2019 | Nishino | G01R 31/26 |
| 2020/0057580 | A1* | 2/2020 | Kim | G11C 16/3418 |

FOREIGN PATENT DOCUMENTS

| | | |
|---|---|---|
| CN | 208546343 | 2/2019 |
| TW | 201308908 | 2/2013 |
| TW | 201319534 | 5/2013 |

OTHER PUBLICATIONS

"Office Action of China Counterpart Application", dated Mar. 1, 2021, p. 1-p. 14.

\* cited by examiner

TEMPERATURE CONTROL CIRCUIT, MEMORY STORAGE DEVICE AND TEMPERATURE CONTROL METHOD

CROSS-REFERENCE TO RELATED APPLICATION

This application claims the priority benefit of Taiwan application serial no. 108112772, filed on Apr. 11, 2019. The entirety of the above-mentioned patent application is hereby incorporated by reference herein and made a part of this specification.

BACKGROUND

Technical Field

The disclosure relates to a temperature control technique for an electronic device, and more particularly, to a temperature control circuit, a memory storage device and a temperature control method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

When a temperature of the memory storage device or other type of electronic device is overly high, internal circuits or stored data may be damaged. Therefore, in general, the temperature of the device may be detected by a temperature detector, and a system frequency may be decreased by a frequency divider circuit to try to lower the temperature of the device. However, in practice, adjusting the system frequency simply according to the temperature often leads to an excessive reduction in the system frequency, which greatly affects the device performance.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a temperature control circuit, a memory storage device and a temperature control method capable of solving the above problem.

An exemplary embodiment of the disclosure provides a temperature control circuit for an electronic device. The temperature control circuit includes a temperature detector, a status detection circuit and a control circuit. The temperature detector is configured to detect a temperature of the electronic device and generate first evaluation information. The status detection circuit is configured to detect a work status of at least one circuit module in the electronic device and generate second evaluation information. The control circuit is coupled to the temperature detector and the status detection circuit and configured to adjust at least one electronic parameter of the electronic device according to the first evaluation parameter and the second evaluation parameter to control the temperature of the electronic device.

An exemplary embodiment of the disclosure further provides a memory storage device, which includes a connection interface unit, a rewritable non-volatile memory module, a memory control circuit unit and a temperature control circuit. The connection interface unit is configured to couple to a host system. The temperature control circuit is coupled to the connection interface unit, the rewritable non-volatile memory module and the memory control circuit unit. The temperature control circuit is configured to detect a temperature of the memory storage device and generate first evaluation information. The temperature control circuit is further configured to detect a work status of at least one circuit module in the memory storage device and generate second evaluation information. The temperature control circuit is further configured to adjust at least one electronic parameter of the memory storage device according to the first evaluation parameter and the second evaluation parameter to control the temperature of the memory storage device.

An exemplary embodiment of the disclosure further provides a temperature control method for a memory storage device. The temperature control method includes: detecting a temperature of the memory storage device and generating first evaluation information; detecting a work status of at least one circuit module in the memory storage device and generating second evaluation information; and adjusting at least one electronic parameter of the memory storage device according to the first evaluation parameter and the second evaluation parameter to control the temperature of the memory storage device.

Based on the above, after detecting the temperature of the electronic device and the work status of the at least one circuit module in the electronic device, the control circuit can adjust the at least one electronic parameter of the electronic device according to the corresponding evaluation information to control the temperature of the electronic device. Since the electronic parameter is adjusted by detecting the work status of the circuit module in addition to the temperature, a more precise balance between a temperature control and a system performance may be achieved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
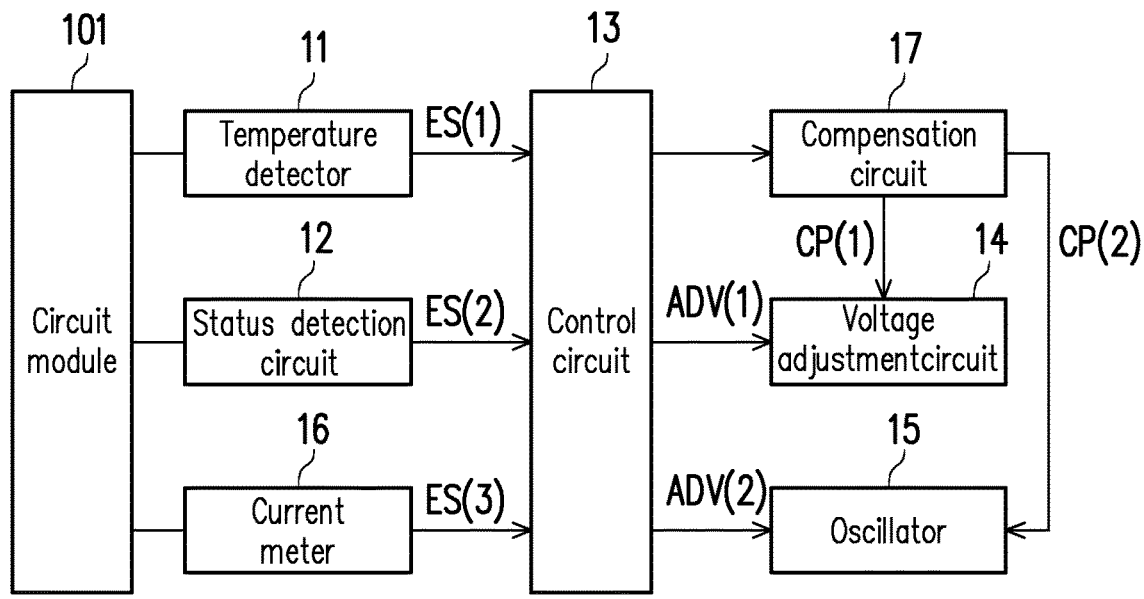
FIG. 1 is a schematic diagram illustrating a temperature control circuit according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Embodiments are provided below to describe the present disclosure in detail, though the present disclosure is not limited to the provided embodiments, and the provided embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

FIG. 1 is a schematic diagram illustrating a temperature control circuit according to an exemplary embodiment of the disclosure. With reference to FIG. 1, a temperature control circuit 10 may be disposed in any type of electronic device to control (or adjust) a temperature of the electronic device. In an exemplary embodiment, the electronic device may be a memory storage device for storing data. Alternatively, in another exemplary embodiment, the electronic device may also be other types of electronic devices, which are not particularly limited by the disclosure.

In an exemplary embodiment, the temperature control circuit 10 includes a temperature detector 11, a status detection circuit 12 a control circuit 13, a voltage adjustment circuit 14 and an oscillator 15. The temperature detector 11 is configured to detect the temperature of the electronic device and generate corresponding evaluation information (a.k.a. first evaluation information) ES(1). For example, the temperature detector 11 may include a thermocouple, a thermistor or other types of temperature sensing elements. The temperature detector 11 can generate the evaluation information ES(1) according to the detected temperature. In other words, the evaluation information ES(1) can reflect the detected temperature of the electronic device.

The status detection circuit 12 is configured to detect a work status of a circuit module 101 in the electronic device and generate corresponding evaluation information (a.k.a. second evaluation information) ES(2). The evaluation information ES(2) can reflect the work status of the circuit module 101. It should be noted that, a quantity of the circuit module 101 may be one or more, and is not particularly limited by the disclosure. In addition, one control module 101 may be one chip module, one controller module, one driving circuit module or one flash memory module, and a type, a circuit composition and a function of the control module 101 is not particularly limited by the disclosure. In an exemplary embodiment, electronic circuits in the electronic device that may generate power consumption all belong to one particular circuit module 101.

In an exemplary embodiment, the work status of the circuit module 101 corresponds to a busy status of the circuit module 101. For example, according to the detected work status of the circuit module 101, the status detection circuit 12 can obtain the busy status of the circuit module 101. This busy status can reflect whether the circuit module 101 is currently in the busy or idle status. The status detection circuit 12 can generate the evaluation information ES(2) according to the work status of the circuit module 101.

In an exemplary embodiment, the evaluation information ES(1) and ES(2) may be transmitted in form of current or other signals. For example, in an exemplary embodiment, the temperature detector 11 can convert the detected temperature into an output current (a.k.a. a first current) and the status detection circuit 12 can convert the detected work status into an output current (a.k.a. a second current). A current value of the first current may be positively correlated to the detected temperature of the electronic device. A current value of the second current may be positively correlated to the detected busy degree of the circuit module 101.

The control circuit 13 is coupled to the temperature detector 11 and the status detection circuit 12. The control circuit 13 can receive evaluation information ES(1) and ES(2) from the temperature detector 11 and the status detection circuit 12, respectively. The control circuit 13 can adjust at least one electronic parameter of the electronic device according to the evaluation information ES(1) and ES(2) to control the temperature of the electronic device. The control circuit 13 may include one or more controllers or other types of control elements.

The voltage adjustment circuit 14 is coupled to the control circuit 13 and configured to output a voltage (a.k.a. a system voltage). The oscillator 15 is coupled to the control circuit 13 and configured to output a clock signal (a.k.a. a system clock signal or a reference clock signal). The voltage output by the voltage adjustment circuit 14 and the clock signal output by the oscillator 15 may be used by various electronic circuits and/or electronic elements in the electronic device. According to the evaluation information ES(1) and ES(2), the control circuit 13 can send an adjustment signal ADV(1) to the voltage adjustment circuit 14 and/or send an adjustment signal ADV(2) to the oscillator 15. The voltage adjustment circuit 14 can dynamically adjust (e.g., increase or decrease) a voltage value of the output voltage according to the adjustment signal ADV(1). The oscillator 15 can dynamically adjust (e.g., increase or decrease) a frequency (a.k.a. a system frequency) of the output clock signal according to the adjustment signal ADV(2).

In an exemplary embodiment, the electronic parameter includes the system voltage and/or the system frequency. The control circuit 13 can decrease the voltage value of the voltage output by the voltage adjustment circuit 14 (i.e., the system voltage) and/or decrease the frequency of the clock signal output by the oscillator 15 (i.e., the system frequency) by adjusting at least one of the adjustment signals ADV(1) and ADV(2) to lower the temperature of the electronic device. In an exemplary embodiment, the system voltage and/or the system frequency being decreased may lead to a reduction in the system performance of the electronic device. Therefore, if it is not required to continuously lower the temperature, the control circuit 13 can increase the voltage value of the voltage output by the voltage adjustment circuit 14 and/or increase the frequency of the clock signal output by the oscillator 15 by adjusting at least one of the adjustment signals ADV(1) and ADV(2) to restore the system performance of the electronic device. It should be noted that, in an exemplary embodiment, the electronic parameter may further include other types of parameters that can be used to adjust the temperature of the electronic device, such as a work mode of a specific electronic circuit, which are not particularly limited by the disclosure.

In an exemplary embodiment, it is assumed that the circuit module 101 includes at least two circuit modules. The circuit modules may be electrically independent from each other or electrically connected to each other. The status detection circuit 12 can detect a work status (a.k.a. a first work status) of one circuit module (a.k.a. a first circuit module) in the circuit modules 101. The status detection circuit 12 can detect a work status (a.k.a. a second work status) of another circuit module (a.k.a. a second circuit module) in the circuit modules 101. The status detection circuit 12 can generate the evaluation information ES(2) according to the first work status, the second work status, weight information (a.k.a. first weight information) of the first circuit module and weight information (a.k.a. second weight information) of the second circuit module. It should be noted that, the first weight information may be identical to or different from the second weight information. For example, the first weight information may include one weight value (a.k.a. a first weight value), and the second weight information may include another weight value (a.k.a. a second weight value). The first weight value may be identical to or different from the second weight value.

Figure 2:
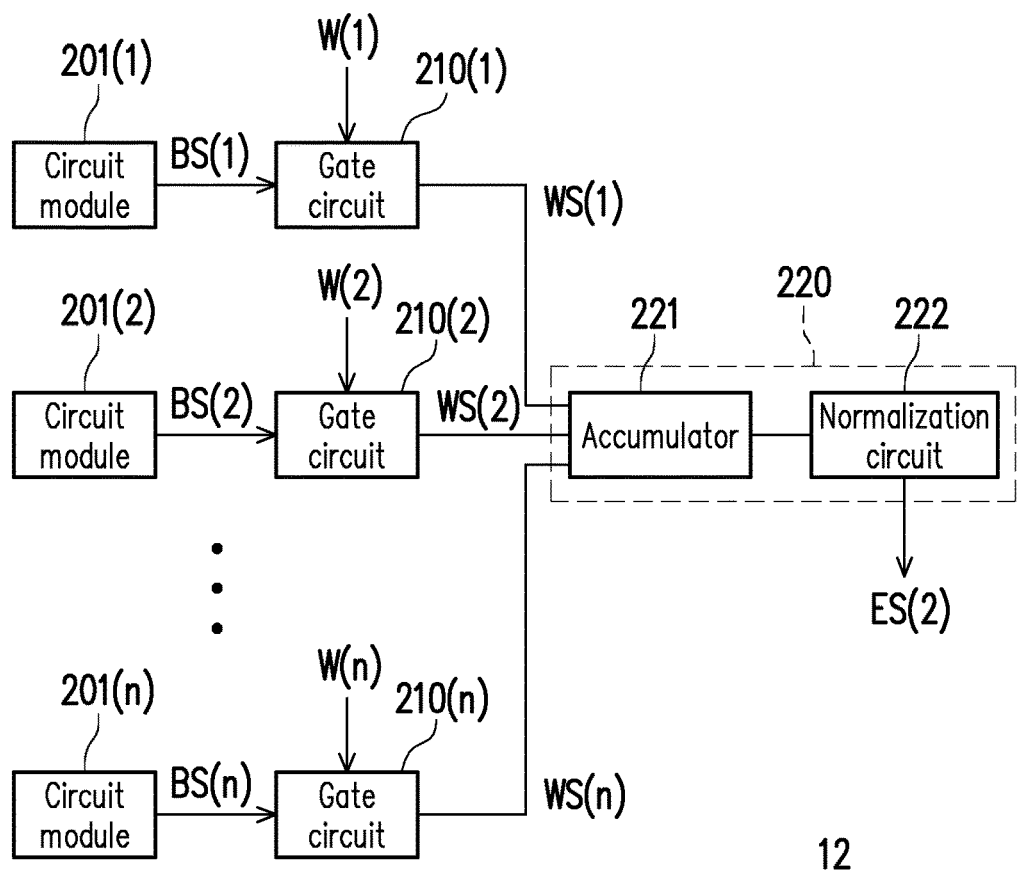
FIG. 2 is a schematic diagram illustrating a status detection circuit according to an exemplary embodiment of the disclosure.

FIG. 2 is a schematic diagram illustrating a status detection circuit according to an exemplary embodiment of the disclosure. With reference to FIG. 2, in an exemplary embodiment, the status detection circuit 12 includes gate circuits 210(1) to 210(n) and a logic circuit 220. The gate circuits 210(1) to 210(n) can be respectively coupled to circuit modules 201(1) to 201(n) to detect work statuses of the circuit modules 201(1) to 201(n). For example, the gate circuits 210(1) to 210(n) may detect status signals BS(1) to BS(n) from the circuit modules 201(1) to 201(n), respectively. The status signals BS(1) to BS(n) reflect the work statuses or (or busy statuses) of the circuit modules 201(1) to 201(n), respectively. With the status signal BS(1) as an example, the status signal BS(1) being logic high can indicate that the circuit module 201(1) is currently in the busy status, and the status signal BS(1) being logic low can indicate that the circuit module 201(1) is currently not in the busy status.

The gate circuits 210(1) to 210(n) can also receive weight signals W(1) to W(n), respectively. The weight signals W(1) to W(n) correspond to the circuit modules 201(1) to 201(n), respectively. For example, the weight signals W(1) to W(n) may reflect weight information corresponding to the circuit modules 201(1) to 201(n), respectively.

The gate circuits 210(1) to 210(n) can generate output signals WS(1) to WS(n) according to the status signals BS(1) to BS(n) and the weight signals W(1) to W(n). For example, the gate circuit 210(1) may generate the output signal WS(1) according to the status signal BS(1) and the weight signal W(1). The status signal BS(1) reflects the work status of the circuit module 201(1). The weight signal W(1) reflects the weight information corresponding to the circuit module 201(1). For example, the gate circuit 210(2) may generate the output signal WS(2) according to the status signal BS(2) and the weight signal W(2). The status signal BS(2) reflects the work status of the circuit module 201(2). The weight signal W(2) reflects the weight information corresponding to the circuit module 201(2).

In an exemplary embodiment, the weight information corresponding to one circuit module relates to a property, an area and/or a power consumption of that circuit module. With the circuit module 201(1) as an example, the weight signal W(1) may be positively correlated to the area and/or the power consumption of the circuit module 201(1). That is to say, if the area and/or the power consumption of the circuit module 201(1) is greater, the weight information (e.g., the weight value) reflected by the weight signal W(1) is greater. Alternatively, with the circuit modules 201(1) and 201(2) as an example, if the area of the circuit module 201(1) is greater than the area of the circuit module 201(2) and/or the power consumption of the circuit module 201(1) is greater than the power consumption of the circuit module 201(2), the weight information (e.g., the weight value) reflected by the weight signal W(1) may be greater than the weight information (e.g., the weight value) reflected by the weight signal W(2).

The logic circuit 220 is coupled to the gate circuits 210(1) to 210(n). The logic circuit 220 can generate the evaluation information ES(2) according to the output signals WS(1) to WS(n). For example, the logic circuit 220 may accumulate the output signals WS(1) to WS(n) to generate the evaluation information ES(2). In addition, the logic circuit 220 can perform a normalization on an accumulated result of the signals WS(1) to WS(n) to generate the evaluation information ES(2).

In an exemplary embodiment, the logic circuit 220 includes an accumulator 221 and a normalization circuit 222. An output of the accumulator 221 is coupled to an input of the normalization circuit 222. The accumulator 221 can receive the output signals WS(1) to WS(n) and accumulate the output signals WS(1) to WS(n) to generate accumulation information. The accumulation information can reflect a sum of logic values respectively corresponding to the signals WS(1) to WS(n). The normalization circuit 222 can receive the accumulation information and perform a normalization operation on the accumulation information to generate the evaluation information ES(2).

In an exemplary embodiment, it is assumed that the status signals BS(1) and BS(2) are both logic high (corresponding to the logic value "1"), the rest of the status signals are all logic low (corresponding to the logic value "0"), and the weight signals WS(1) and WS(2) correspond to the weight values "10" and "5", respectively. The gate circuit 210(1) can multiply the logic value "1" corresponding to the status signal BS(1) by the weight value "10" corresponding to the weight signal WS(1) to generate the output signal WS(1) corresponding to the logic value "10" (i.e., 1×10=10). The gate circuit 210(2) can multiply the logic value "1" corresponding to the status signal BS(2) by the weight value "5" corresponding to the weight signal WS(2) to generate the output signal WS(2) corresponding to the logic value "5" (i.e., 1×5=5). The accumulator 221 can obtain the sum of the logic values "10" and "5" which is the logic value "15" (i.e., 10+5=15, the accumulation information). Then, the normalization circuit 222 can add an adjustment value to the logic value "15" to generate the evaluation information ES(2). For example, if the adjustment value is the logic value "200", the evaluation information ES(2) may correspond to the logic value "215" (i.e., 15+200=215). Accordingly, the normalization circuit 222 can output a current of 215 milliamps (mA) (i.e., the second current).

It should be noted that, in another exemplary embodiment, the adjustment value may also be other values, depending on actual requirements. In addition, the normalization operation described above is merely an example, and implementation details of the normalization operation performed by the normalization circuit 222 are not particularly limited by the disclosure. For example, in another exemplary embodiment, the normalization circuit 222 may also generate the evaluation information ES(2) through other logic operations (e.g., by multiplying the accumulation information by a adjustment value).

In an exemplary embodiment, the temperature control circuit 10 of FIG. 1 further includes a current meter 16. The current meter 16 is coupled to the circuit module 101 and the control circuit 13. The current meter 16 may be used to detect a current of the electronic device (e.g., the circuit module 101) and generate evaluation information (a.k.a. third evaluation information) ES(3). In other words, the evaluation information ES(3) can reflect the current flowing through at least one detection point of the circuit module 101, and the evaluation information ES(3) can be positively correlated a current value of that current. In addition, the evaluation information ES(3) may also be output in from of a current (a.k.a. a third current).

In an exemplary embodiment, the control circuit 13 can adjust the adjustment signals ADV(1) and/or ADV(2) according to at least one of the evaluation information ES(1) to ES(3). For example, the control circuit 13 may analyze at least one of the evaluation information ES(1) to ES(3) and generate the adjustment signals ADV(1) and/or ADV(2) according to an analysis result. In an exemplary embodiment, the logic value (e.g., the current value) corresponding to at least one of the evaluation information ES(1) to ES(3) may be positively correlated to an adjustment amount (or an adjustment range) of the electronic parameter. For example, in the case where the control circuit 13 generates the adjustment signal ADV(1) according to the evaluation information ES(1), if the logic value of the evaluation information ES(1) is greater, a voltage drop of an output voltage of the voltage adjustment circuit 14 may be greater. Alternatively, in the case where the control circuit 13 generates the adjustment signal ADV(2) according to the evaluation information ES(1) and ES(2), if the logic values of the evaluation information ES(1) and/or ES(2) are greater, a frequency fall of an output clock of the oscillator 15 may be greater.

Figure 3:
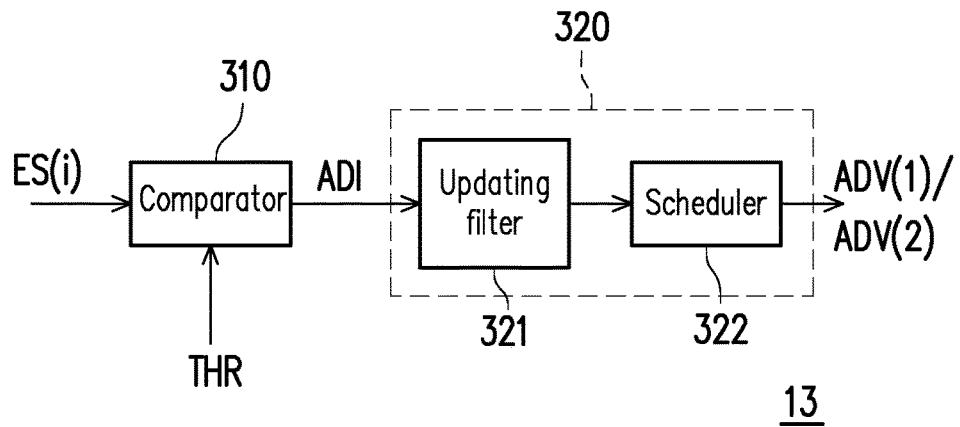
FIG. 3 is a schematic diagram illustrating a control circuit according to an exemplary embodiment of the disclosure.

FIG. 3 is a schematic diagram illustrating a control circuit according to an exemplary embodiment of the disclosure. With reference to FIG. 3, in an exemplary embodiment, the control circuit 13 includes a comparator 310 and an adjustment circuit 320. An output of the comparator 310 is coupled to an input of the adjustment circuit 320. The comparator 310 can receive the evaluation information ES(i) and threshold information THR. The evaluation information ES(i) may be one of the evaluation information ES(1) to ES(3). The comparator 310 can generate adjustment information ADI according to the evaluation information ES(i) and the threshold information THR. For example, the comparator 310 may compare the evaluation information ES(i) with the threshold information THR and generate the adjustment information ADI according to a comparison result. The adjustment circuit 320 can generate the adjustment signals ADV(1) and/or ADV(2) according to the adjustment information ADI. According to the adjustment signals ADV(1) and/or ADV(2), at least one electronic parameter of the electronic device may be adjusted from an electronic parameter (a.k.a. a first electronic parameter) to another electronic parameter (a.k.a. a second electronic parameter) to lower the temperature of the electronic device. For example, if the system voltage is currently 0.9 V, the adjustment circuit 320 may generate the adjustment signal ADV(1) to lower the system voltage to 0.7 V. In addition, during the process of adjusting the temperature of the electronic device, the evaluation information ES(i) may be switched between the evaluation information ES(1) to ES(3).

In an exemplary embodiment, the adjustment circuit 320 includes an updating filter 321 and a scheduler 322. An output of the updating filter 321 is coupled to an input of the scheduler 322. The updating filter 321 is configured to filter noises and/or surges in the evaluation information ES(i). The scheduler 322 is configured to generate the adjustment signals ADV(1) and/or ADV(2) according to the output of the updating filter 321. For example, according to a set scheduling rule, the scheduler 322 may generate at least one of the adjustment signals ADV(1) and ADV(2). For example, the scheduling rule may be determined according to the evaluation information ES(i). For example, the scheduler 322 may determine the scheduling rule to be used according to the current temperature of the electronic device (or the evaluation information ES(1)). In addition, the set scheduling rules may be different in different temperature ranges.

Figure 4:
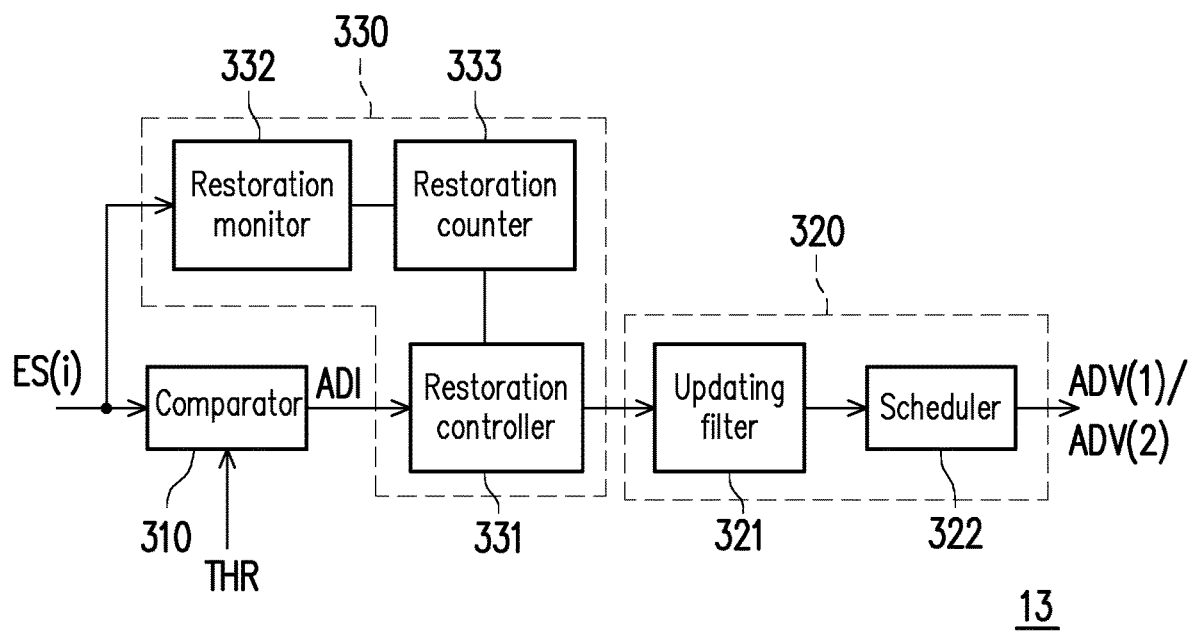
FIG. 4 is a schematic diagram illustrating a control circuit according to an exemplary embodiment of the disclosure.

FIG. 4 is a schematic diagram illustrating a control circuit according to an exemplary embodiment of the disclosure. With reference to FIG. 4, in an exemplary embodiment, the control circuit 13 includes the comparator 310 and the adjustment circuit 320 and a restoration circuit 330. The restoration circuit 330 is coupled to the comparator 310 and the adjustment circuit 320. The restoration circuit 330 can determine whether at least one of the evaluation information ES(1) to ES(3) meets a preset condition. If at least one of the evaluation information ES(1) to ES(3) meets the preset condition, the restoration circuit 330 can restore the adjusted electronic parameter from the second electronic parameter to the first electronic parameter. By doing so, after the temperature is lowered by adjusting a part of electronic parameters of the electronic device to the second electronic parameter, the restoration circuit 330 can be used to restore (e.g., increase) at least part of the system performance.

In an exemplary embodiment, the restoration circuit 330 includes a controller (a.k.a. a restoration controller) 331, a monitor (a.k.a. a restoration monitor) 332 and a counter (a.k.a. a restoration counter) 333. The restoration monitor 332 can receive the evaluation information ES(i) and continuously analyze the evaluation information ES(i). If the evaluation information ES(i) meets a trigger condition, the restoration monitor 332 can activate the restoration counter 333 to start counting. If a count value of the restoration counter 333 meets a preset value, the restoration controller 331 can instruct the adjustment circuit 320 to generate the corresponding adjustment signals ADV(1) and/or ADV(2) to restore the adjusted electronic parameter from the second electronic parameter to the first electronic parameter.

In an exemplary embodiment, after the temperature of the electronic device is lowered by adjusting certain electronic parameters to the second electronic parameter, the restoration monitor 332 can continuously determine whether the temperature of the electronic device reaches a preset temperature (or a preset temperature range) according to the evaluation information ES(1). If the temperature of the electronic device reaches the preset temperature, the restoration monitor 332 can activate the restoration counter 333 to count a maintenance time of the temperature of the electronic device being maintained at the preset temperature. The restoration controller 331 can restore the adjusted electronic parameter from the second electronic parameter to the first electronic parameter according to the maintenance time. For example, after the maintenance time of the temperature of the electronic device being maintained at one preset temperature (or in one preset temperature range) reaches a preset time, the restoration controller 331 can instruct the adjustment circuit 320 to update at least one of the adjustment signals ADV(1) and ADV(2) to increase the system voltage and/or the system frequency. Alternatively, if the maintenance time of the temperature of the electronic device being maintained at the preset temperature (or in the preset temperature range) does not reached the preset time, the restoration controller 331 can instruct the adjustment circuit 320 to maintain (or not updating) the adjustment signals ADV(1) and/or ADV(2). In addition, after the restoration counter 333 is activated, if the temperature of the electronic device is no longer at the preset temperature, the restoration monitor 332 can reset the restoration counter 333.

In other words, after the temperature of the electronic device is lowered and stabilized, the control circuit 13 can slightly increase the system voltage and/or the system frequency through the restoration circuit 330. Accordingly, the system performance of the electronic device may be gradually restored during the process of lowering the temperature of the electronic device. In addition, if the temperature of the electronic device rises again beyond an allowable range, the control circuit 13 can lower the system voltage and/or the system frequency again according to the evaluation information ES(i) to lower the temperature of the electronic device.

In an exemplary embodiment, the temperature control circuit 10 of FIG. 1 further includes a compensation circuit 17. The compensation circuit 17 can generate at least one compensation parameter according to the temperature of the electronic device to compensate at least one analog circuit related to the electronic parameter. For example, the compensation circuit 17 may be coupled to the control circuit 13, the voltage adjustment circuit 14 and the oscillator 15. The compensation circuit 17 can obtain the temperature of the electronic device according to the evaluation information ES(1). The compensation circuit 17 can generate compensation parameters CP(1) and/or CP(2) according to the temperature. The compensation parameter CP(1) may be provided to the voltage adjustment circuit 14, and the compensation parameter CP(2) may be provided to the oscillator 15. Accordingly, under different temperature statuses, the voltage adjustment circuit 14 and the oscillator 15 can compensate (or adjust) the output signals according to the compensation parameters CP(1) and CP(2), respectively. It should be noted that, the compensation circuit 17 may further compensate other types of analog circuits other than the voltage adjustment circuit 14 and the oscillator 15 of FIG. 1.

Figure 5:
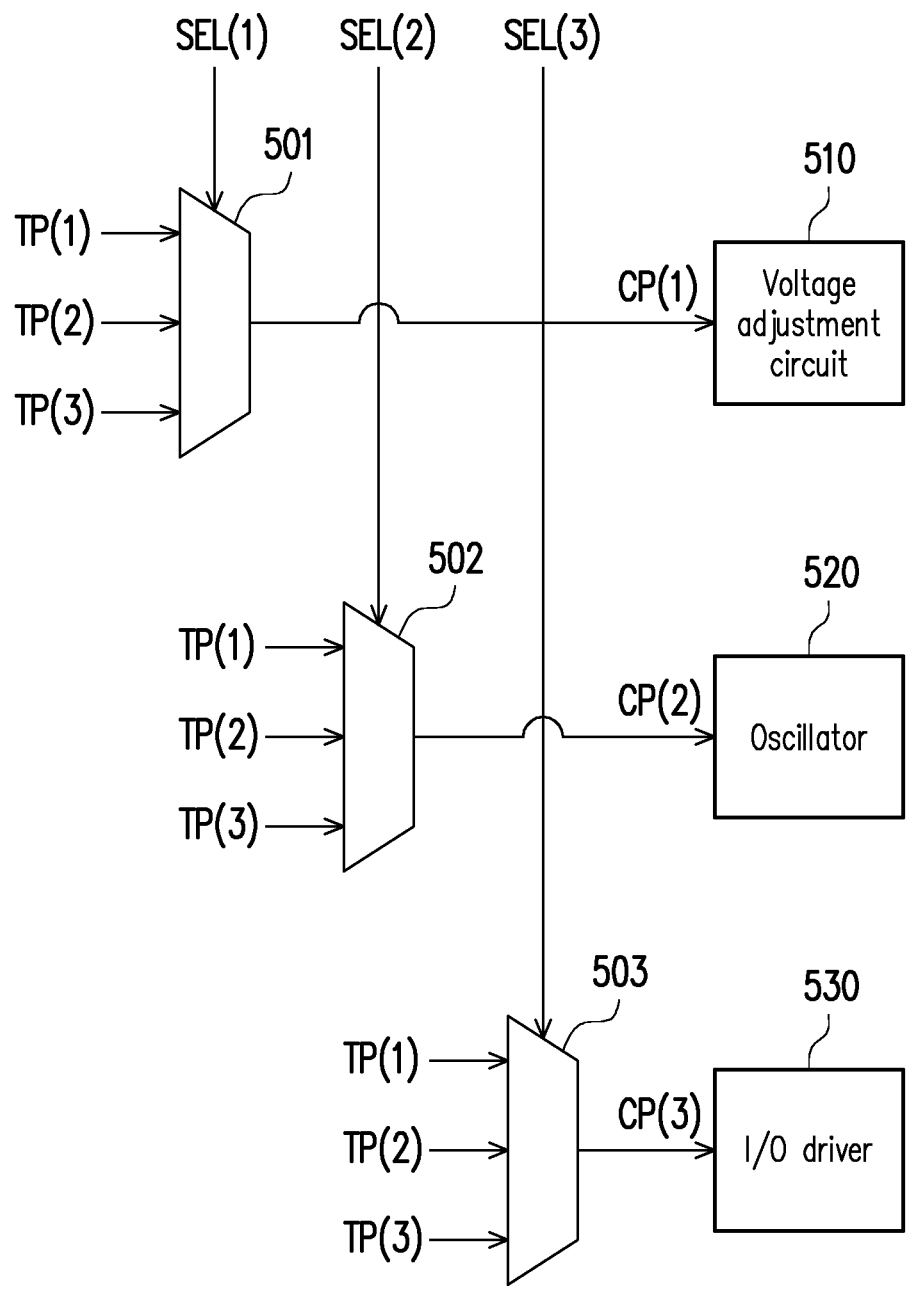
FIG. 5 is a schematic diagram illustrating a compensation circuit according to an exemplary embodiment of the disclosure.

FIG. 5 is a schematic diagram illustrating a compensation circuit according to an exemplary embodiment of the disclosure. With reference to FIG. 5, the compensation circuit 17 may include multiplexers 501 to 503. The multiplexers 501 to 503 may all be used to receive compensation parameters TP(1) to TP(3). The compensation parameters TP(1) to TP(3) have different compensation capabilities for the circuits. Output terminals of the multiplexers 501 to 503 are coupled to a voltage adjustment circuit 510, an oscillator 520 and an input/output (I/O) driver 530, respectively. Under different temperature statuses, the compensation circuit 17 can selectively provide one of the compensation parameters TP(1) to TP(3) to the voltage adjustment circuit 510, the oscillator 520 and/or the I/O driver 530 through selection signals SEL(1) to SEL(3).

In an exemplary embodiment, the compensation parameters TP(1) to TP(3) respectively correspond to a first temperature range, a second temperature range and a third temperature range. Temperatures in the first temperature range are higher than temperatures in the second temperature range, and the temperatures in the second temperature range are higher than temperatures in the third temperature range. If the compensation circuit 17 determines that the current temperature of the electronic device belongs to the first temperature range, the compensation circuit 17 can provide the compensation parameter TP(1) to the voltage adjustment circuit 510, the oscillator 520 and/or the I/O driver 530 through the selection signals SEL(1) to SEL(3), so as to compensate outputs of the voltage adjustment circuit 510, the oscillator 520 and/or the I/O driver 530. If the compensation circuit 17 determines that the current temperature of the electronic device belongs to the second temperature range, the compensation circuit 17 can provide the compensation parameter TP(2) to the voltage adjustment circuit 510, the oscillator 520 and/or the I/O driver 530 through the selection signals SEL(1) to SEL(3), so as to compensate the outputs of the voltage adjustment circuit 510, the oscillator 520 and/or the I/O driver 530. If the compensation circuit 17 determines that the current temperature of the electronic device belongs to the third temperature range, the compensation circuit 17 can provide the compensation parameter TP(3) to the voltage adjustment circuit 510, the oscillator 520 and/or the I/O driver 530 through the selection signals SEL(1) to SEL(3), so as to compensate the outputs of the voltage adjustment circuit 510, the oscillator 520 and/or the I/O driver 530.

In an exemplary embodiment, the circuit module (e.g., the circuit module 101 of FIG. 1 or the circuit modules 201(1) to 201(n) of FIG. 2) may also include the analog circuits to be compensated according to the electronic parameter as described above. For example, in another exemplary embodiment of FIG. 1, the voltage adjustment circuit 14 and/or the oscillator 15 may also be included in the circuit module 101.

In an exemplary embodiment, the electronic parameter may further include an input voltage of a circuit module (e.g., the circuit module 201(1) of FIG. 2), an output voltage of a circuit module and/or the weight information corresponding to a circuit module (e.g., the weight signal W(1) corresponding to the circuit module 201(1) of FIG. 2). Based on different temperature statuses and/or different work statuses, the electronic parameters of at least part of the electronic circuits in the circuit module 101 may also be dynamically adjusted according to at least one of the evaluation information ES(1) to ES(3). With FIG. 2 as an example, based on the different temperature statuses and/or different work statuses of at least one electronic circuit in the circuit module 201(1), the weight value (i.e., the weight information) corresponding to the weight signal W(1) may be dynamically adjusted. Accordingly, the more precise balance between the temperature control and the system performance may be achieved.

It should be noted that, in the foregoing exemplary embodiments, coupling relationships between the various circuit elements are merely examples instead of limitations to the disclosure. In the foregoing exemplary embodiments, the coupling relationships between at least part of the circuit elements may be adjusted, and at least part of the circuit elements may be replaced by other circuit elements with identical or similar functions and/or added with more circuit elements to provide additional functions.

In an exemplary embodiment, the temperature control circuit 10 of FIG. 1 may be disposed in a memory storage device or a memory control circuit unit. Alternatively, in an exemplary embodiment, the temperature control circuit 10 of FIG. 1 may also be disposed in any type of electronic device, which is not particularly limited by the disclosure.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 6:
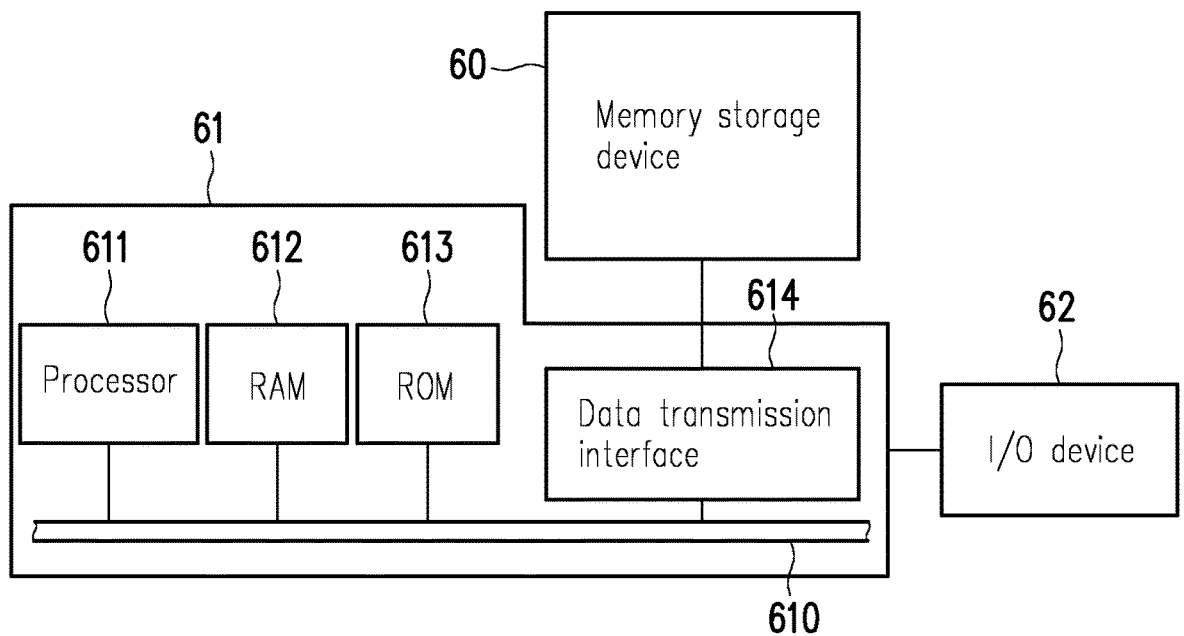
FIG. 6 is a schematic diagram illustrating a host system, a memory storage device and an I/O (input/output) device according to an exemplary embodiment of the disclosure.
Figure 7:
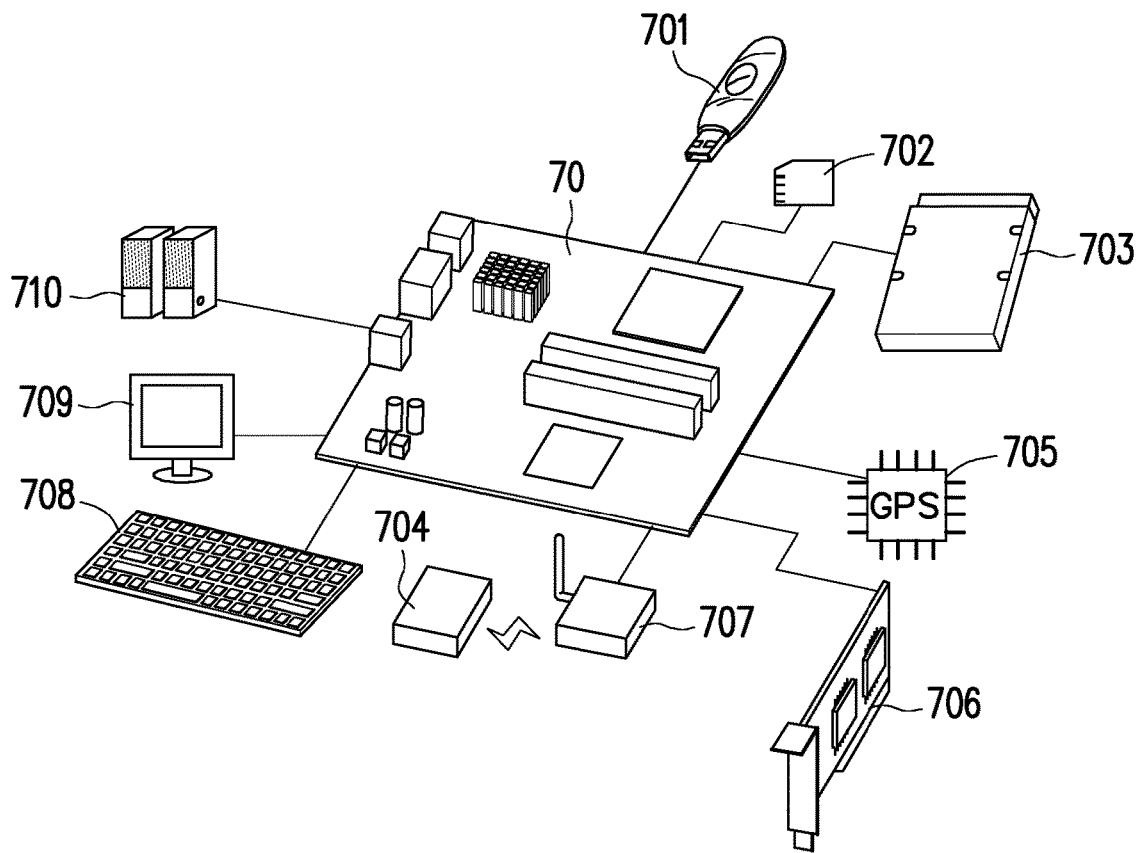
FIG. 7 is a schematic diagram illustrating a host system, a memory storage device and an I/O device according to another exemplary embodiment of the disclosure.

FIG. 6 is a schematic diagram illustrating a host system, a memory storage device and an I/O (input/output) device according to an exemplary embodiment of the disclosure. FIG. 7 is a schematic diagram illustrating a host system, a memory storage device and an I/O device according to another exemplary embodiment of the disclosure.

Referring to FIG. 6 and FIG. 7, a host system 61 generally includes a processor 611, a RAM (random access memory) 612, a ROM (read only memory) 613 and a data transmission interface 614. The processor 611, the RAM 612, the ROM 613 and the data transmission interface 614 are coupled to a system bus 610.

In this exemplary embodiment, the host system 61 is coupled to a memory storage device 60 through the data transmission interface 614. For example, the host system 61 can store data into the memory storage device 60 or read data from the memory storage device 60 via the data transmission interface 614. Further, the host system 61 is coupled to an I/O device 62 via the system bus 610. For example, the host system 61 can transmit output signals to the I/O device 62 or receive input signals from the I/O device 62 via the system bus 610.

In the present exemplary embodiment, the processor 611, the RAM 612, the ROM 613 and the data transmission interface 614 may be disposed on a main board 70 of the host system 61. The number of the data transmission interface 614 may be one or more. Through the data transmission interface 614, the main board 70 may be coupled to the memory storage device 60 in a wired manner or a wireless manner. The memory storage device 60 may be, for example, a flash drive 701, a memory card 702, a SSD (Solid State Drive) 703 or a wireless memory storage device 704. The wireless memory storage device 704 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 70 may also be coupled to various I/O devices including a GPS (Global Positioning System) module 705, a network interface card 706, a wireless transmission device 707, a keyboard 708, a monitor 709 and a speaker 710 through the system bus 610. For example, in an exemplary embodiment, the main board 70 can access the wireless memory storage device 704 via the wireless transmission device 707.

Figure 8:
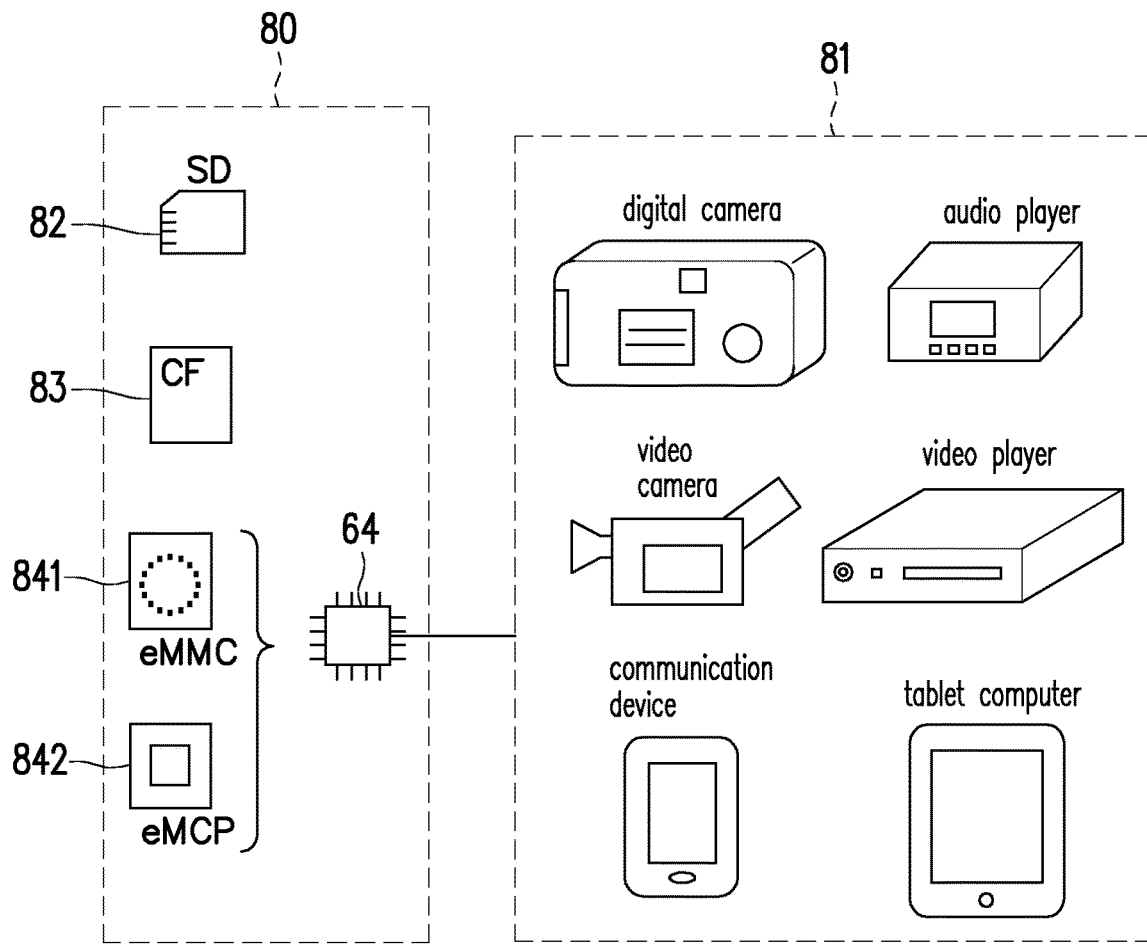
FIG. 8 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 8 is a schematic diagram illustrating a host system and a memory storage device according to another exemplary embodiment of the disclosure. Referring to FIG. 8, in another exemplary embodiment, a host system 81 may also be a system such as a digital camera, a video camera, a communication device, an audio player, a video player or a tablet computer, whereas a memory storage device 80 may be various non-volatile memory storage devices, such as a SD (Secure Digital) card 82, a CF (Compact Flash) card 83 or an embedded storage device 64. The embedded storage device 84 includes various embedded storage devices capable of directly coupling a memory module onto a substrate of the host system, such as an eMMC (embedded Multi Media Card) 841 and/or an eMCP (embedded Multi Chip Package) storage device 842.

Figure 9:
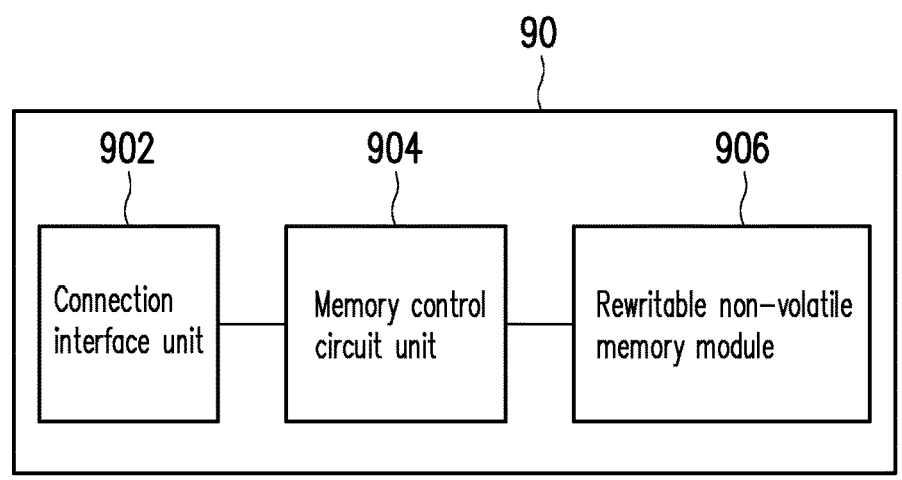
FIG. 9 is a schematic block diagram illustrating a memory storage device according to an exemplary embodiment of the disclosure.

FIG. 9 is a schematic block diagram illustrating a memory storage device according to an exemplary embodiment of the disclosure. Referring to FIG. 9, the memory storage device 90 includes a connection interface unit 902, a memory control circuit unit 904 and a rewritable non-volatile memory module 906.

The connection interface unit 902 is configured to couple to the memory storage device 90 to the host system 61 of FIG. 6. The memory storage device 90 can communicate with the host system 61 through the connection interface unit 902. In this exemplary embodiment, the connection interface unit 902 is compatible with a SATA (Serial Advanced Technology Attachment) standard. Nevertheless, it should be understood that the disclosure is not limited in this regard. The connection interface unit 902 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 902 and the memory control circuit unit 904 may be packaged into one chip, or the connection interface unit 902 is distributed outside of a chip containing the memory control circuit unit 904.

The memory control circuit unit 904 is configured to execute a plurality of logic gates or control commands which are implemented in a hardware form or in a firmware form and perform operations of writing, reading or erasing data in the rewritable non-volatile memory module 906 according to the commands of the host system 61.

The rewritable non-volatile memory module 906 is coupled to the memory control circuit unit 904 and configured to store data written from the host system 61. The rewritable non-volatile memory module 906 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 906, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 906 can have a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 906 can constitute a plurality of physical programming units, and the physical programming units can constitute a plurality of physical erasing units. Specifically, the memory cells on the same word line can constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units can include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment, the rewritable non-volatile memory module 906 of FIG. 9 is also known as a flash memory module. In an exemplary embodiment, the memory control circuit unit 904 of FIG. 9 is also known as a flash memory controller for controlling the flash memory module.

Figure 10:
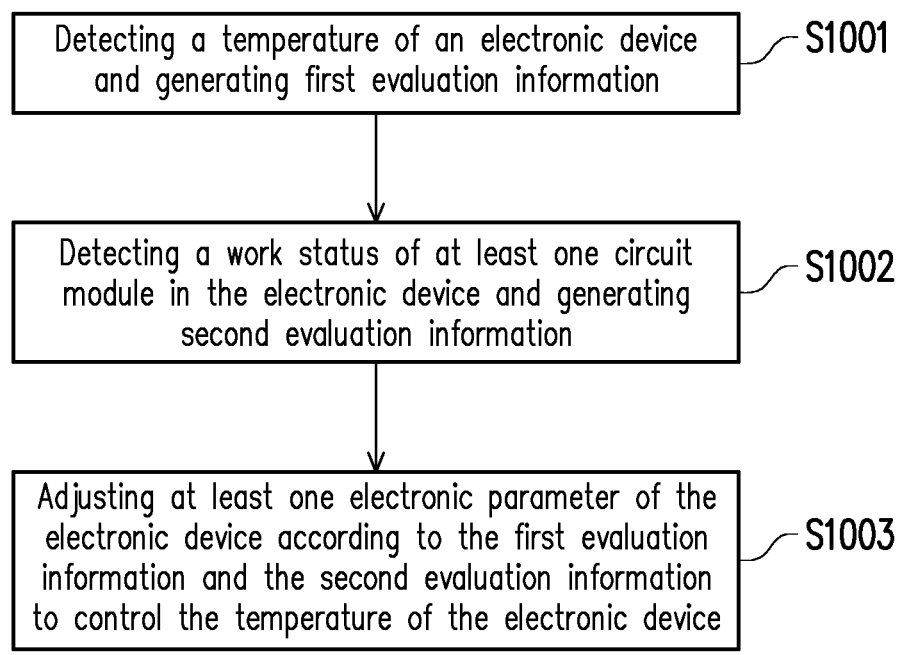
FIG. 10 is a flowchart illustrating a temperature control method according to an exemplary embodiment of the disclosure.

FIG. 10 is a flowchart illustrating a temperature control method according to an exemplary embodiment of the disclosure. With reference to FIG. 10, in step S1001, a temperature of an electronic device (e.g., a memory storage device) is detected and first evaluation information is generated. In step S1002, a work status of at least one circuit module in the electronic device is detected and second evaluation information is generated. In step S1003, at least one electronic parameter of the electronic device is adjusted according to the first evaluation information and the second evaluation information to control the temperature of the electronic device.

In summary, after detecting the temperature of the electronic device and the work status of the at least one circuit module in the electronic device, the control circuit can adjust at least one electronic parameter of the electronic device according to the corresponding evaluation information to control the temperature of the electronic device. Since the electronic parameter is adjusted by detecting the work status of the circuit module in addition to the temperature, the more precise balance between the temperature control and the system performance may be achieved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A temperature control circuit for an electronic device, comprising:
    a temperature detector, configured to detect a temperature of the electronic device and generate first evaluation information;
    a status detection circuit, configured to detect a work status of at least one circuit module in the electronic device and generate second evaluation information without referring to a detection result of the temperature detector, wherein the second evaluation information reflects whether the at least one circuit module is in a busy status; and
    a control circuit, coupled to the temperature detector and the status detection circuit and configured to receive the first evaluation information and the second evaluation information and adjust at least one electronic parameter of the electronic device according to the first evaluation information and the second evaluation information to control the temperature of the electronic device, and the adjusting of the at least one electronic parameter of the electronic device.

2. The temperature control circuit according to claim 1, wherein the at least one circuit module comprises a first circuit module and a second circuit module, and an operation that the status detection circuit detects the work status of the at least one circuit module in the electronic device and generates the second evaluation information comprises:
   detecting a first work status of the first circuit module;
   detecting a second work status of the second circuit module; and
   generating the second evaluation information according to the first work status, the second work status, first weight information of the first circuit module and second weight information of the second circuit module.

3. The temperature control circuit according to claim 2, wherein the status detection circuit comprises:
   a first gate circuit, configured to generate a first output signal according to a first status signal and a first weight signal, wherein the first status signal reflects the first work status, and the first weight signal reflects the first weight information;
   a second gate circuit, configured to generate a second output signal according to a second status signal and a second weight signal, wherein the second status signal reflects the second work status, and the second weight signal reflects the second weight information; and
   a logic circuit, coupled to the first gate circuit and the second gate circuit and configured to generate the second evaluation information according to the first output signal and the second output signal.

4. The temperature control circuit according to claim 3, wherein the logic circuit comprises:
   an accumulator, coupled to the first gate circuit and the second gate circuit and configured to generate accumulation information according to the first output signal and the second output signal; and
   a normalization circuit, coupled to the accumulator and configured to generate the second evaluation information according to the accumulation information.

5. The temperature control circuit according to claim 1, wherein the work status of the at least one circuit module corresponds to the busy status of the at least one circuit module.

6. The temperature control circuit according to claim 1, further comprising:
   a current meter, coupled to the control circuit and configured to detect a current of the electronic device and generate third evaluation information,
   wherein the control circuit further adjusts the at least one electronic parameter of the electronic device according to the third evaluation information.

7. The temperature control circuit according to claim 1, wherein the control circuit comprises:
   a comparator, configured to generate adjustment information according to the second evaluation information and at least one threshold information; and
   an adjustment circuit, coupled to the comparator and configured to adjust the at least one electronic parameter of the electronic device from a first electronic parameter to a second electronic parameter according to the adjustment information to lower the temperature of the electronic device.

8. The temperature control circuit according to claim 7, wherein the control circuit further comprises:
   a restoration circuit, coupled to the adjustment circuit and configured to restore the at least one electronic parameter from the second electronic parameter to the first electronic parameter if at least one of the first evaluation information and the second evaluation information meets a preset condition.

9. The temperature control circuit according to claim 8, wherein the restoration circuit comprises:
   a counter, configured to count a maintenance time of the temperature of the electronic device at a preset temperature; and
   a restoration controller, coupled to the counter and configured to restore the at least one electronic parameter to the first electronic parameter according to the maintenance time.

10. The temperature control circuit according to claim 1, further comprising:
    a compensation circuit, coupled to the control circuit and configured to generate at least one compensation parameter according to the temperature of the electronic device to compensate at least one analog circuit related to the at least one electronic parameter.

11. The temperature control circuit according to claim 1, wherein the at least one electronic parameter comprises at least one of a system voltage of the electronic device, a system frequency of the electronic device, an input voltage of the at least one circuit module, an output voltage of the at least one circuit module and weight information of the at least one circuit module.

12. A memory storage device, comprising:
    a connection interface unit, configured to couple to a host system;
    a rewritable non-volatile memory module;
    a memory control circuit unit; and
    a temperature control circuit, coupled to the connection interface unit, the rewritable non-volatile memory module and the memory control circuit unit,
    wherein the temperature control circuit is configured to detect a temperature of the memory storage device and generate first evaluation information,
    the temperature control circuit is further configured to detect a work status of at least one circuit module in the memory storage device and generate second evaluation information without referring to a detection result of the temperature, wherein the second evaluation information reflects whether the at least one circuit module is in a busy status, and
    the temperature control circuit is further configured to adjust at least one electronic parameter of the memory storage device according to the first evaluation information and the second evaluation information to control the temperature of the memory storage device.

13. The memory storage device according to claim 12, wherein the at least one circuit module comprises a first circuit module and a second circuit module, and an operation that the temperature control circuit detects the work status of the at least one circuit module in the memory storage device and generates the second evaluation information comprises:
    detecting a first work status of the first circuit module;
    detecting a second work status of the second circuit module; and generating the second evaluation information according to the first work status, the second work status, first weight information of the first circuit module and second weight information of the second circuit module.

14. The memory storage device according to claim 13, wherein an operation that the temperature control circuit generates the second evaluation information according to the first work status, the second work status, the first weight information of the first circuit module and the second weight information of the second circuit module comprises:
generating a first output signal according to a first status signal and a first weight signal, wherein the first status signal reflects the first work status, and the first weight signal reflects the first weight information;
generating a second output signal according to a second status signal and a second weight signal, wherein the second status signal reflects the second work status, and the second weight signal reflects the second weight information; and
generating the second evaluation information according to the first output signal and the second output signal.

15. The memory storage device according to claim 14, wherein an operation that the temperature control circuit generates the second evaluation information according to the first output signal and the second output signal comprises:
generating accumulation information according to the first output signal and the second output signal; and
generating the second evaluation information according to the accumulation information.

16. The memory storage device according to claim 12, wherein the work status of the at least one circuit module corresponds to the busy status of the at least one circuit module.

17. The memory storage device according to claim 12, wherein the temperature control circuit is further configured to detect a current of the memory storage device and generate third evaluation information, and
the temperature control circuit is further configured to adjust the at least one electronic parameter of the memory storage device according to the third evaluation information.

18. The memory storage device according to claim 12, wherein an operation that the temperature control circuit adjusts the at least one electronic parameter of the memory storage device according to the first evaluation parameter and the second evaluation parameter to control the temperature of the memory storage device comprises:
generating adjustment information according to the second evaluation information and at least one threshold information; and
adjusting the at least one electronic parameter of the memory storage device from a first electronic parameter to a second electronic parameter according to the adjustment information to lower the temperature of the memory storage device.

19. The memory storage device according to claim 18, wherein the operation that the temperature control circuit adjusts the at least one electronic parameter of the memory storage device according to the first evaluation parameter and the second evaluation parameter to control the temperature of the memory storage device further comprises:
restoring the at least one electronic parameter from the second electronic parameter to the first electronic parameter if at least one of the first evaluation information and the second evaluation information meets a preset condition.

20. The memory storage device according to claim 19, wherein an operation that the temperature control circuit restores the at least one electronic parameter from the second electronic parameter to the first electronic parameter if the at least one of the first evaluation information and the second evaluation information meets the preset condition comprises:
counting a maintenance time of the temperature of the memory storage device at a preset temperature; and
restoring the at least one electronic parameter to the first electronic parameter according to the maintenance time.

21. The memory storage device according to claim 12, wherein the temperature control circuit is further configured to generate at least one compensation parameter according to the temperature of the memory storage device to compensate at least one analog circuit related to the at least one electronic parameter.

22. The memory storage device according to claim 12, wherein the at least one electronic parameter comprises at least one of a system voltage of the memory storage device, a system frequency of the memory storage device, an input voltage of the at least one circuit module, an output voltage of the at least one circuit module and weight information of the at least one circuit module.

23. A temperature control method for a memory storage device, and the temperature control method comprising:
detecting a temperature of the memory storage device and generating first evaluation information;
detecting a work status of at least one circuit module in the memory storage device and generating second evaluation information without referring to a detection result of the temperature, wherein the second evaluation information reflects whether the at least one circuit module is in a busy status; and
adjusting at least one electronic parameter of the memory storage device according to the first evaluation information and the second evaluation information to control the temperature of the memory storage device.

24. The temperature control method according to claim 23, wherein the at least one circuit module comprises a first circuit module and a second circuit module, and a step of detecting the work status of the at least one circuit module in the memory storage device and generating the second evaluation information comprises:
detecting a first work status of the first circuit module;
detecting a second work status of the second circuit module; and
generating the second evaluation information according to the first work status, the second work status, first weight information of the first circuit module and second weight information of the second circuit module.

25. The temperature control method according to claim 24, wherein a step of generating the second evaluation information according to the first work status, the second work status, the first weight information of the first circuit module and the second weight information of the second circuit module comprises:
generating a first output signal according to a first status signal and a first weight signal, wherein the first status signal reflects the first work status, and the first weight signal reflects the first weight information;
generating a second output signal according to a second status signal and a second weight signal, wherein the second status signal reflects the second work status, and the second weight signal reflects the second weight information; and generating the second evaluation information according to the first output signal and the second output signal.

26. The temperature control method according to claim 25, wherein a step of generating the second evaluation information according to the first output signal and the second output signal comprises:

generating accumulation information according to the first output signal and the second output signal; and generating the second evaluation information according to the accumulation information.

27. The temperature control method according to claim 23, wherein the work status of the at least one circuit module corresponds to the busy status of the at least one circuit module.

28. The temperature control method according to claim 23, further comprising:

detecting a current of the memory storage device and generating third evaluation information; and adjusting the at least one electronic parameter of the memory storage device according to the third evaluation information.

29. The temperature control method according to claim 23, wherein a step of adjusting the at least one electronic parameter of the memory storage device according to the first evaluation parameter and the second evaluation parameter to control the temperature of the memory storage device comprises:

generating adjustment information according to the second evaluation information and at least one threshold information; and adjusting the at least one electronic parameter of the memory storage device from a first electronic parameter to a second electronic parameter according to the adjustment information to lower the temperature of the memory storage device.

30. The temperature control method according to claim 29, wherein the step of adjusting the at least one electronic parameter of the memory storage device according to the first evaluation parameter and the second evaluation parameter to control the temperature of the memory storage device further comprises:

restoring the at least one electronic parameter from the second electronic parameter to the first electronic parameter if at least one of the first evaluation information and the second evaluation information meets a preset condition.

31. The temperature control method according to claim 30, wherein a step of restoring the at least one electronic parameter from the second electronic parameter to the first electronic parameter if the at least one of the first evaluation information and the second evaluation information meets the preset condition comprises:

counting a maintenance time of the temperature of the memory storage device at a preset temperature; and restoring the at least one electronic parameter to the first electronic parameter according to the maintenance time.

32. The temperature control method according to claim 23, further comprising:

generating at least one compensation parameter according to the temperature of the memory storage device to compensate at least one analog circuit related to the at least one electronic parameter.

33. The temperature control method according to claim 23, wherein the at least one electronic parameter comprises at least one of a system voltage of the memory storage device, a system frequency of the memory storage device, an input voltage of the at least one circuit module, an output voltage of the at least one circuit module and weight information of the at least one circuit module.

* * * * *